(12) United States Patent
Kroon et al.

(10) Patent No.: US 7,145,641 B2
(45) Date of Patent: Dec. 5, 2006

(54) LITHOGRAPHIC APPARATUS, DEVICE MANUFACTURING METHOD, AND DEVICE MANUFACTURED THEREBY

(75) Inventors: Mark Kroon, Utrecht (NL); Michael Cornelis Van Beek, Eindhoven (NL); Peter Dirksen, Valkenswaard (NL); Ralph Kurt, Eindhoven (NL); Cassandra May Owen, Chandler, AZ (US)

(73) Assignee: ASML Netherlands, B.V., Veldhoven (NL)

( * ) Notice: Subject to any disclaimer, the term of this patent is extended or adjusted under 35 U.S.C. 154(b) by 114 days.

(21) Appl. No.: 10/748,751

(22) Filed: Dec. 31, 2003

(65) Prior Publication Data

US 2005/0140956 A1 Jun. 30, 2005

(51) Int. Cl.
G03B 27/72 (2006.01)
G03B 27/42 (2006.01)
G03B 27/52 (2006.01)
G03G 27/54 (2006.01)

(52) U.S. Cl. ............................ 355/71; 355/53; 355/55; 355/63; 355/67

(58) Field of Classification Search .................. 355/71, 355/53, 55, 63, 67; 359/350
See application file for complete search history.

(56) References Cited

U.S. PATENT DOCUMENTS 5,696,623 A 12/1997 Fujie et al.

FOREIGN PATENT DOCUMENTS

| EP | 0 706 042 A1 | 4/1996 |
| EP | 0 874 283 A2 | 10/1998 |
| EP | 0 874 283 A3 | 1/2000 |
| EP | 1 037 036 A1 | 9/2000 |
| EP | 1 526 550 A1 | 4/2005 |
| JP | 2005-123305 A | 5/2005 |
| WO | WO 2005/111722 A2 | 11/2005 |

OTHER PUBLICATIONS

International Search Report issued for PCT Application PCT/NL2004/000927 on Dec. 19, 2005.

*Primary Examiner*—Peter B. Kim
(74) *Attorney, Agent, or Firm*—Pillsbury Winthrop Shaw Pittman LLP

(57) ABSTRACT

A lithographic apparatus is disclosed. The apparatus includes a radiation system that provides a beam of radiation, and a support structure that supports a patterning structure. The patterning structure is configured to pattern the beam of radiation according to a desired pattern. The apparatus also includes a substrate support that supports a substrate, and a projection system that projects the patterned beam onto a target portion of the substrate. The projection system includes an optical element that has a beam entry area and an optical element that has a beam exit area through each of which the patterned beam passes. The apparatus further includes a nucleated surface that is associated with the projection system on which a plurality of nucleation sites are provided. The surface is disposed away from at least one of the beam entry area and the beam exit area.

18 Claims, 6 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates generally to a lithographic projection apparatus, and more specifically to a lithographic projection apparatus with a fluid cleaning system.

2. Description of Related Art

The term "patterning device" or "patterning structure" as here employed should be broadly interpreted as referring to a device or structure that can be used to endow an incoming radiation beam with a patterned cross-section, corresponding to a pattern that is to be created in a target portion of the substrate. The term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens". However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

It has been found that used G- and I-line and deep UV microlithography lenses suffer from degradation in terms of loss of overall transmission and loss of wafer illumination uniformity.

In a purged system, i.e., a system that is purged with a purging gas, this degradation is mainly caused by the occurrence of contamination on the surfaces of the first and last optical element in the projection system, i.e., the first optical element encountered by the projection beam and the last optical element encountered by the projection beam in the projection system. It will be understood, however, that in systems that are not purged, crystal growth is likely on other surfaces of the projection system in addition to the surfaces of the first and the last optical elements. Such contamination comprises dendritic salt structures which grow on the lens surfaces. It has been found that lenses subject to intense radiation over a period of time, typically a few years, become contaminated with salt structures. This problem is not limited to the particular type of radiation used, but has been found to occur with radiation of 365 nm, 248 nm, 193 nm, 157 nm as well as extreme ultra violet (EUV) lithography. It is mentioned that EUV lithography apparatus are typically not purged systems. The origin of the lens surface contamination appears to be refractory compounds, such as silane, being present at very low concentrations, i.e., parts per million (ppm) to parts per billion (ppb) in the purge air, which is used as a medium in the lithographic apparatus to stabilize conditions within the apparatus, and have even been found in purified nitrogen used for special purging purposes. Irradiation induced chemical surface reactions of silanes, sulphates or phosphates in combination with the presence of other gases, such as, for example, oxygen, water, and ammonia, are considered to be the basis degradation mechanism. It is believed that nucleation as well as growth of the contaminating crystals occur during exposure with radiation of the G-, I-, deep UV and EUV wavelengths. It is believed that these wavelengths, at least, cause a particular photochemical reaction to occur.

Conventionally, this problem has been addressed by mechanical or chemical cleaning with a non-scratching cloth wetted with specific chemicals. It has been found, however, that this conventional approach results in a spreading or distribution of salt growth nuclei over the entire lens surface. Subsequent use of the lens in the projection system results in accelerated growth of the contamination over the entire "cleaned" lens surface. This effect dramatically reduces the optical throughput, the optical imaging quality and the time between subsequent cleaning. After a number of cleaning rounds, it has been found that removal of the surface contamination becomes more difficult. The occurrence of contamination may finally require a complete interchange of the dirty projection system with a new system, which is very expensive.

The problem of removing contaminants from cooling air is addressed in U.S. Pat. No. 5,696,623, which discloses an air purge system including a method for cleaning cooling gas in a semiconductor manufacturing device. The method includes exposing the cooling air to ultraviolet radiation. One problem with this particular prior art is that it is necessary to cool the air. It has been found that exposing air to ultraviolet prior to it being passed through the lens system does not eliminate salt crystal growth.

SUMMARY OF THE INVENTION

It is an aspect of the present invention to address the problems encountered with conventional fluid cleaning systems.

This and other aspects are achieved according to embodiments of the invention in a lithographic apparatus comprising: a radiation system for providing a projection beam of radiation; a support structure for supporting the patterning device, the patterning device serving to pattern the projection beam according to a desired pattern; a substrate table for holding a substrate; and a projection system for projecting the patterned beam onto a target portion of the substrate, the projection system including an optical element having a beam entry area and an optical element having a beam exit area through each of which the patterned beam passes, characterized by a nucleated surface on which a plurality of nucleation sites are provided with one of which a contaminant present in or around said projection system associates, said surface being disposed away from at least one of said beam entry area or said beam exit area.

In an embodiment, a lithographic projection apparatus is provided. The apparatus includes a radiation system that provides a beam of radiation, and a support structure that supports a patterning structure. The patterning structure is configured to pattern the beam of radiation according to a desired pattern. The apparatus also includes a substrate support that supports a substrate, and a projection system that projects the patterned beam onto a target portion of the substrate. The projection system includes an optical element that has a beam entry area and an optical element that has a beam exit area through each of which the patterned beam passes. The apparatus further includes a nucleated surface that is associated with the projection system on which a plurality of nucleation sites are provided. The surface is disposed away from at least one of the beam entry area and the beam exit area.

This arrangement provides an advantage in that a contaminating salt growth is eliminated from an optical element in the projection system, while causing minimal impact to the performance of the apparatus. A further advantage is that cooling of the fluid is not necessary to achieve cleaning of it.

According to a further aspect of the present invention, the nucleated surface is made of the same material as at least one of the optical elements.

This arrangement provides an advantage that the nucleated surface acts as a "dummy" surface, that is, contaminants that would otherwise contaminate the optical element, due to the particular material of the optical element, contaminate the "dummy" surface instead. By association with the nucleated surface, the contaminant is retained on the dummy surface, thus preventing any further contamination by the same contaminant.

In an embodiment, a lithographic projection apparatus is provided. The apparatus includes a first radiation system that provides a beam of radiation and a support structure that supports a patterning structure. The patterning structure is configured to pattern the projection beam according to a desired pattern. The apparatus also includes a substrate support that supports a substrate, and a projection system that projects the patterned beam onto a target portion of the substrate. The projection system includes an optical element that has a beam entry area and an optical element that has a beam exit area through each of which the patterned beam passes. The apparatus further includes a fluid cleaning system that cleans a fluid to be introduced into a region in which the optical element is disposed. The fluid cleaning system includes a fluid inlet that receives fluid to be cleaned and a fluid outlet that supplies cleaned fluid to the region of the apparatus, a cleaning zone that cleans the received fluid, the cleaning zone being disposed between said inlet and said outlet, and a second radiation system that provides radiation to the cleaning zone to cause dissociation of a contaminant present in the fluid in the cleaning zone. The apparatus also includes a nucleated surface provided with a plurality of nucleation sites. The nucleated surface is disposed in the cleaning zone.

According to a further aspect there is provided a fluid cleaning system for use in an apparatus, said system comprising: a fluid inlet for receiving gas to be cleaned and a fluid outlet and supply system for supplying cleaned fluid to an apparatus; a cleaning zone disposed between said inlet and said outlet; and a radiation source arranged, in use, to be incident on said cleaning zone; characterized in that said radiation source causes dissociation of a contaminant present in said fluid in said cleaning zone; and in that said fluid cleaning system further comprises: a nucleated surface disposed in said cleaning zone, on which a plurality of nucleation sites are provided with one of which said dissociated contaminant associates.

In an embodiment, a fluid cleaning system for use in an apparatus is provided. The system includes a fluid inlet that receives fluid to be cleaned and a fluid outlet that supplies cleaned fluid to an apparatus, a cleaning zone disposed between the inlet and the outlet, a radiation source arranged to be incident on the cleaning zone to cause dissociation of a contaminant present in the fluid in the cleaning zone, and a nucleated surface disposed in the cleaning zone, on which a plurality of nucleation sites are provided.

In an embodiment, a method of cleaning a fluid for use in an apparatus is provided, The method includes receiving a fluid to be cleaned at an inlet and supplying a cleaned fluid to an apparatus at an outlet, cleaning the fluid in a cleaning zone disposed between the inlet and the outlet, using a radiation source to cause dissociation of a contaminant present in the fluid in the cleaning zone, and providing a nucleated surface in the cleaning zone, on which a plurality of nucleation sites are provided.

This arrangement provides the advantage in that the fluid is cleaned to ultra high standards because the contaminant is retained in the cleaning zone. In particular, salt crystal growth which, after time, damages expensive apparatus components is eliminated. Thus, the life time of the apparatus is increased. The costs of the fluid cleaning system are limited because there is no precision optics required and no precise tuning of the fluid cleaning system or the apparatus is required.

According to a further aspect of the invention there is provided a device manufacturing method comprising the steps of: providing a substrate that is at least partially covered by a layer of radiation-sensitive material; providing a projection beam of radiation using a radiation system; using a patterning device to endow the projection beam with a pattern in its cross-section; and projecting the patterned beam of radiation using an optical element having a beam entry area and an optical element having a beam exit area through each of which said patterned beam passes, onto a target portion of the layer of radiation-sensitive material, characterized by providing a nucleated surface on which a plurality of nucleation sites are provided with one of which a dissociated contaminant present in or around said projection system associates, and disposing said surface away from at least one of said beam entry area or said beam exit area.

In an embodiment, a device manufacturing method is provided. The method includes projecting a beam of radiation, patterning the beam of radiation, projecting the patterned beam of radiation using an optical element having a beam entry area and an optical element having a beam exit area through each of which the patterned beam passes, onto a target portion of the layer of radiation-sensitive material, and capturing contaminants with a plurality of nucleation sites spaced from at least one of the beam entry area and the beam exit area. A dissociated contaminant present in or around a projection system associates with at least one of the plurality of nucleation sites.

In an embodiment, a contamination detector for detecting contaminants in a fluid is provided. The detector includes a fluid path along which the fluid flows, a detection zone disposed in said fluid path, and a radiation source arranged to be incident on the detection zone. The radiation source causes dissociation of a contaminant present in the fluid in the detection zone. The detector also includes a nucleated surface disposed in the detection zone, on which a plurality of nucleation sites are provided; and an optical measuring device for determining an optical characteristic of the nucleated surface from which concentration of a contaminant in said fluid is determined.

Although specific reference may be made in this text to the use of the apparatus according to embodiments of the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS OF THE INVENTION

Figure 1:
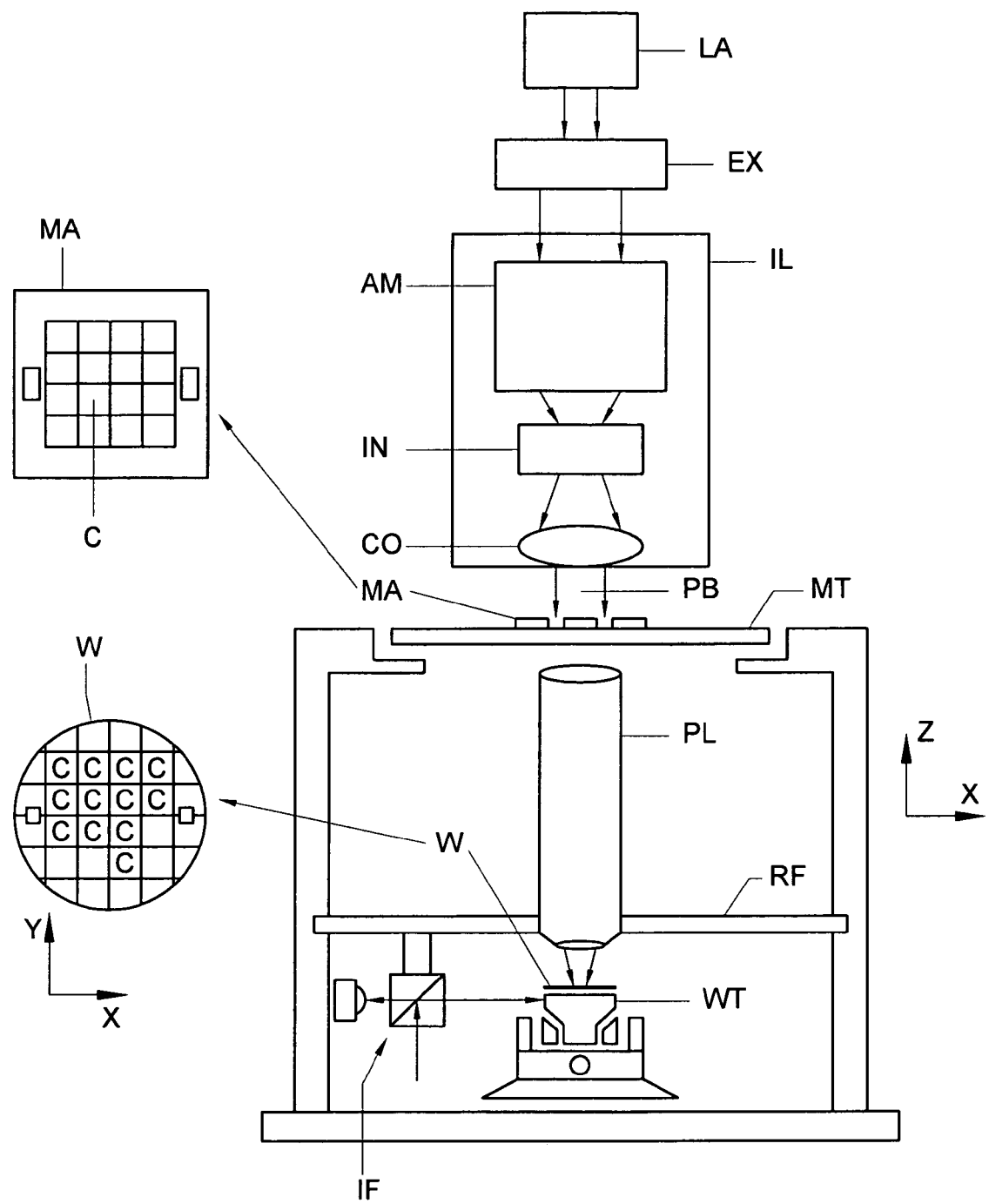
FIG. 1 depicts a lithographic projection apparatus according to an embodiment of the invention.

FIG. 1 schematically depicts a lithographic projection apparatus 1 according to a particular embodiment of the invention. The apparatus comprises: a radiation system Ex, IL, for supplying a projection beam PB of radiation (e.g. 365, 248, 193, 157 nm radiation). In this particular case, the radiation system also comprises a radiation source LA; a first object table (mask table) MT provided with a mask holder for holding a mask MA (e.g. a reticle), and connected to a first positioning device for accurately positioning the mask with respect to item PL; a second object table (substrate table) WT provided with a substrate holder for holding a substrate W (e.g. a resist coated silicon wafer), and connected to a second positioning device for accurately positioning the substrate with respect to item PL; and a projection system ("lens") PL (e.g. an optical lens system) for imaging an irradiated portion of the mask MA onto a target portion C (e.g. comprising one or more dies) of the substrate W. The term "object table" as used herein may also be considered or termed as an object support. It should be understood that the term object support or object table broadly refers to a structure that supports, holds, or carries an object or substrate.

As here depicted, the apparatus is of a transmissive type (i.e. has a transmissive mask). However, in general, it may also be of a reflective type, for example, with a reflective mask. Alternatively, the apparatus may employ another kind of patterning device, such as a programmable mirror array of a type referred to above.

The source LA (e.g. a mercury lamp, a Krypton Fluoride excimer laser or a plasma source) produces a beam of radiation. This beam is fed into an illumination system (illuminator) IL, either directly or after having traversed conditioning means, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross section.

It should be noted with regard to FIG. 1 that the source LA may be within the housing of the lithographic projection apparatus (as is often the case when the source LA is a mercury lamp, for example), but that it may also be remote from the lithographic projection apparatus, with the radiation beam which it produces being led into the apparatus (e.g. with the aid of suitable directing mirrors). This latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device (and an interferometric measuring device IF), the substrate table WT can be moved accurately, e.g., so as to position different target portions C in the path of the beam PB. Similarly, the first positioning device can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks and substrate alignment marks.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and
2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As mentioned, the projection system ("lens") PL, is, for example, an optical lens system for imaging an irradiated portion of the mask MA onto a target portion C. The optical lens system typically includes around thirty lens elements arranged so that the projection beam passes through each lens element. Each lens element has two surfaces through which the projection beam passes. It has been found that the salt growth is most marked on the external lens surfaces, that is the first surface the projection beam passes through on entry into the projection system and the last surface the projection passes through on exiting the projection system. In particular, the projection system includes an optical element having a beam entry area and an optical element having a beam exit area through which said projection beam passes on entry into the projection system and exit out of the projection system, respectively.

The present invention has application to the cleaning of fluids, including gases as well as liquids. In particular, but not exclusively, the invention has application to the cleaning of gases in optical lithography and to the cleaning of liquids in immersion lithography.

Before describing further details of embodiments of the invention, the photochemical reaction is described. It is known from, for example, self assembled monolayering, that functional groups adhere preferably at a given surface, for example, sulphur containing molecules on gold, alcohol and amide groups on platinum, fatty acid groups on silver and silicon dioxide, 1-alkenes on silicon, and alkyl(di) phosphoric acids on mica. The typical contaminants include compounds comprising silicon, calcium, sulphur, phosphorus, aluminium and other metals, further including sulphur dioxide, ammonium sulphate, phosphoric acid, silanes or compounds having a hydrocarbon or fluorocarbon tail including all organic metal complexes. In most cases, only a small part of the compounds, such as an atom or a functional group, remains as the nucleation site for the crystal. The residual (non-nucleation site forming) part, which is typically organic or hydrocarbon is oxidized away in the lithographic apparatus. The salt crystals are known, for example, as "whiskers", nano-tubes or nano-wires, dentrites or refractory compounds. Nucleation as well as growth of crystals derived from the contaminant occurs during exposure with intense radiation, such as that found in lithographic apparatus and apparatus using electron radiation.

Irradiation induced chemical reactions of chemicals, such as silanes, sulphates or phosphates in combination with the presence of other gases such as oxygen, water, ammonia, is the basic contamination salt growth mechanism. Firstly, exposure to the radiation causes the silanes, sulphates or phosphates to dissociate. Secondly, after dissociation, the chemicals reform as other compounds, specifically salt compounds. It has been found that the wavelength in the lithography apparatus produces particular chemical reactions in the environment, because salt compounds would not typically occur in the environment found in the lithographic apparatus, that is an environment of purified, clean, dry air, without the presence of the intense radiation. It has been found that a decrease in the wavelength of the projection beam from for example, 365 nm to 193 nm, EUV and electron irradiation, provides additional energy, which in turn provides more dissociation and, hence more of the damaging salt compounds. Typical salt crystal compounds formed include, for example, magnesium sulphate, magnesium phosphate and ammonium sulphate. These salts, in conventional apparatus deposit onto the lens elements that the light passes through. When the light travels through a lens following salt contamination of that lens, it causes a diffraction of the light passing through the lens. This diffraction of light, also referred to as stray light or flare, causes problems within the lithography process. Salt crystal compounds are formed by rearranging atoms or molecules from a fluid or solution state into ordered solid state. It has been found that in conventional systems, the nucleation mechanism arises as a result of lens imperfections plus impurities. It has also been found that nucleation is needed for crystal growth. However, nucleation takes a lot longer than crystal growth. Thus, once a surface has been nucleated, crystal growth progresses rapidly.

The two major contaminants are sulphur dioxide, which is found in the ambient air, and phosphates from volatile organo-phosphates, which are present in plastics in the lithographic apparatus, for example, as plasticizer or flame retardant. The other reactants, for example, water, ammonia and oxygen with which the contaminants react are present in the ambient air. It is noted, that oxygen is added to the gas present in the apparatus on purpose to oxidize hydrocarbons away. The dissociation of the chemicals depends on factors including the volume and the partial pressure of the reactants, as well as the wavelength of the radiation. It has been found that another factor is the presence of a surface. In particular, it has been found that at a surface, the probability of dissociation and hence, subsequent salt crystal growth, is higher than away from the surface. The embodiments shown and described with reference to FIGS. 5 to 8, in particular, exploit this last factor.

It has been found that the degradation mechanism may take one of at least two possible paths. Two of the major mechanisms are discussed in more detail. According to a first mechanism, the molecule contaminant is present in a gas (or a liquid). When subject to appropriate radiation, the contaminant dissociates to form radicals. The radicals subsequently collect at a surface to form nucleation sites. Crystal growth occurs as a result of rearrangement of the radicals.

According to a second mechanism, the presence of a surface in the reaction zone is necessary. A molecule is adsorbed at the surface. Each adsorbed molecule is adhered to the surface for a certain time. After the certain time, desorbtion occurs and the molecule is released from the surface. The amount of time a particular molecule is retained on the surface varies from molecule to molecule according to the size and the chemistry of the molecule.

It will be understood that if a flow of a gas (or a liquid) containing the molecule is present in a lithographic apparatus, then the chances of nucleation and subsequent crystal growth occurring according to the first mechanism will be reduced with respect to a non-flow condition, because in a flowing environment, the molecule is in the vicinity of the projection lens for only a limited period of time as it passes in the flow past the lens. Thus, if the molecule is adsorbed on the surface, the probability of nucleation is higher because it is retained in a reaction zone for a longer period of time.

Whether a molecule is adsorbed on a surface will depend primarily on the partial pressure of the molecule in a gaseous state (and the concentration of the molecule in a liquid state). The adsorbed molecule adheres to the surface and is subject to the following surface effect: in the reaction zone, the adsorbed molecule may be hit directly by radiation or indirectly. Indirect radiation comprises, for example, secondary electrons generated by the beam of radiation generated by the source of the lithographic apparatus. Whereas in a lithographic apparatus, the beam of radiation may have an energy typically in the region of about 3–100 electronvolts (eV), secondary electrons may have an energy typically in the region of about 5–10 electronvolts (eV). In order to cause dissociation of the adsorbed molecule, energy in the region of approximately 5 electronvolts is required. Thus, the molecule is dissociated either by the beam of radiation or the secondary electrons. The radicals, which are the product of the dissociation, form nucleation sites, further radicals are rearranged to form crystals at the surface around the nucleation sites. Thus, according to the present invention, by providing a surface on which nucleation sites are provided, the crystal growth probability is increased.

When the second mechanism described above occurs, there are two regimes that may occur. According to the first regime, the intensity of light is high with respect to the partial pressure (or concentration) of the molecule. Thus, crystal growth will be determined by the partial pressure (or concentration in a liquid). This regime is referred to as the "molecular flux limit regime", and occurs typically at low partial pressures (or concentrations). According to a second regime, the light intensity is low with respect to the number of molecules in the reaction zone (i.e. there is a relatively high partial pressure (or concentration)). Thus, growth is determined by the intensity of the radiation. This regime is referred to as the "radiation flux limited regime", and is not limited by the partial pressure (or concentration).

It has been found that the regime which is typically encountered in lithographic apparatus is the molecular flux limited regime because there is a low partial pressure (or concentration). Crystal growth typically takes place over a long period of time. In particular, however, the regime to which the present invention is applied is not highly dependent on the intensity of the radiation. Thus, in order for the present invention to work, although the radiation is required to have a certain energy, it does not require a particularly high intensity. In particular, the required intensity is lower than that of a typical beam of radiation produced by the source in a lithographic apparatus.

Figure 2:
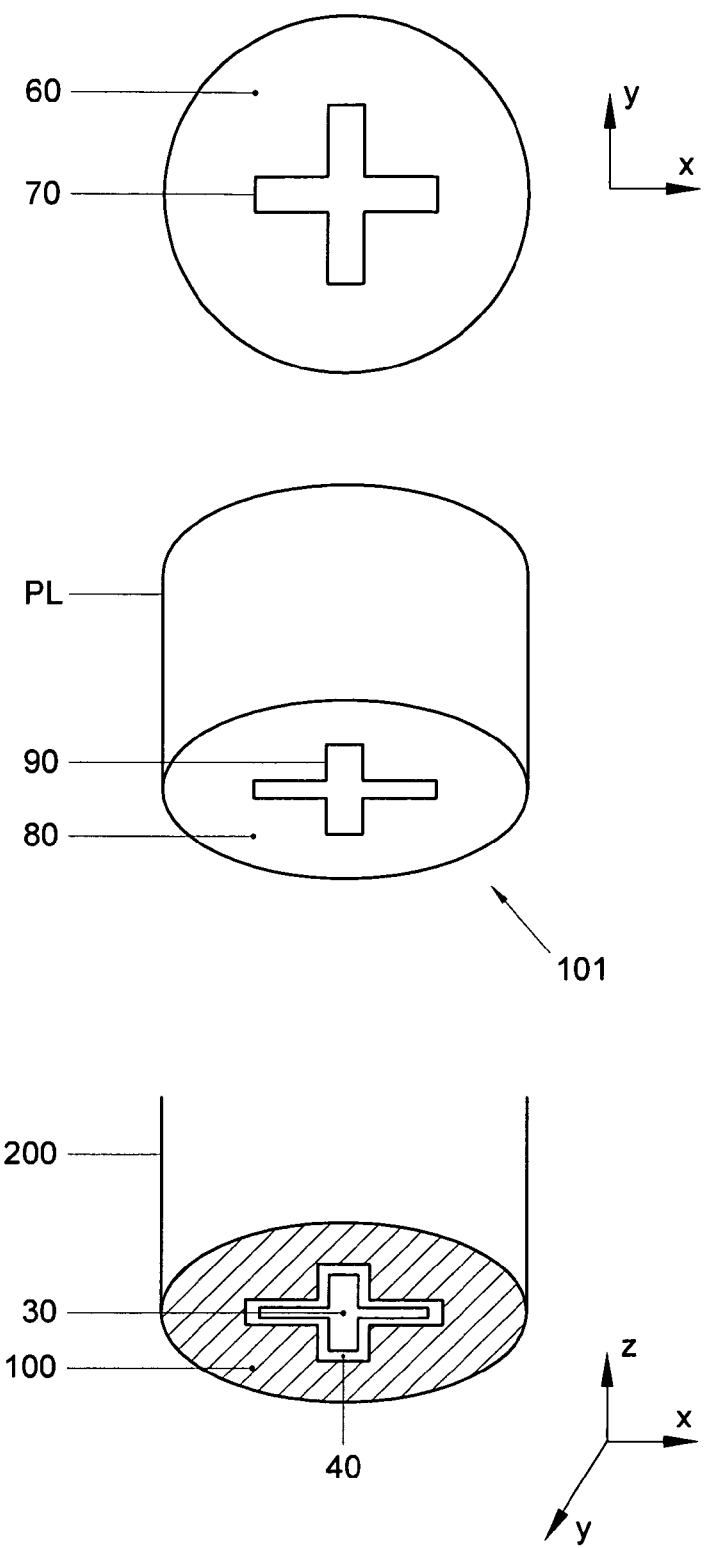
FIG. 2 depicts details of a lithographic apparatus including a projection system protector according to an embodiment of the present invention.

FIG. 2 depicts details of a lithographic apparatus including a projection system protector according to an embodiment of the present invention. In particular, FIG. 2 shows a projection system PL comprising at least one lens element having an entry surface 60 and an exit surface 80. In use, the (patterned) beam enters the projection system via a predetermined area of the entry surface 60, the area of the incident beam is the entry area 70. The beam exits the projection system via a predetermined area of the exit surface 80, the area of the exiting beam is the exit area 90. In the example shown in FIG. 2, the entry and exit area have the shape of a cross. However, the invention is not limited in this respect. Typically, the entry and exit areas correspond to the cross section of the patterned beam in the entry and exit planes of the projection system, respectively, and will vary depending on the particular application. In the example shown in FIG. 2, the entry and exit area have the same shape, however, the invention is not limited in this respect.

Also provided is a nucleated surface 40 on which a plurality of contamination nucleation sites are provided, the surface being disposed away from at least one of the beam entry area or said beam exit area. For example, a nucleated surface may be provided either at the entry to the projection system or the exit, or both. The provision of a nucleated surface away from the beam path initiates crystal growth outside of the critical path of the radiation and off the part of the lens through which the patterned beam passes. Instead, crystal growth is initiated on the prepared surfaces around the perimeter of the path of the beam. The nucleated surface is prepared by providing nucleation sites on the surface. Preferably, the nucleation sites are ideal, that is, the nucleation sites comprise crystal seeds of the compound which is to be grown, and are prepared and provided on the surface prior to installation of the surface. Preferably, the surface is rough. The surface roughness may have a root mean square value of about 3–5 nanometers or more. For example, the nucleated surface 40 may be etched, preferably, lightly etched, quartz with ammonium sulphate salt seeds disposed thereon. Preferably, the nucleation site is made of the same material as the lens element disposed either directly upstream or downstream of the nucleated surface 40, however, this is not essential. Typical materials for the nucleation surface include any lens material including, but not limited to, silicon dioxide, magnesium fluoride, and calcium fluoride.

As can be seen in FIG. 2, the nucleated surface 40 forms part of a protective cap 200 which is disposed in use, as shown by arrow 101, on the end of the projection system. In FIG. 2, the protective cap 200 is shown for provision on the exit end of the projection system. However, as mentioned, it is envisaged that the protective cap may be disposed on either the entry, exit, or both ends of the projection system. Preferably, the nucleated surfaces forms part of a protective cap which fits over at least the exit or entry area of the projection system. Preferably, the nucleated surface 40 is disposed adjacent to either the beam entry area or the beam exit area in the plane of these areas, or both. The dimensions of the nucleated surface are not critical. It is added that according this particular embodiment, it is not necessary for the nucleated surface to be exposed to the radiation in the apparatus. Dissociation will occur in the volume of the apparatus. However, the dissociated molecules will with very high probability form salts at the nucleation sites provided on the nucleated surface 40 because the nucleation sites are seeds on which further crystal growth can occur.

Figure 3:
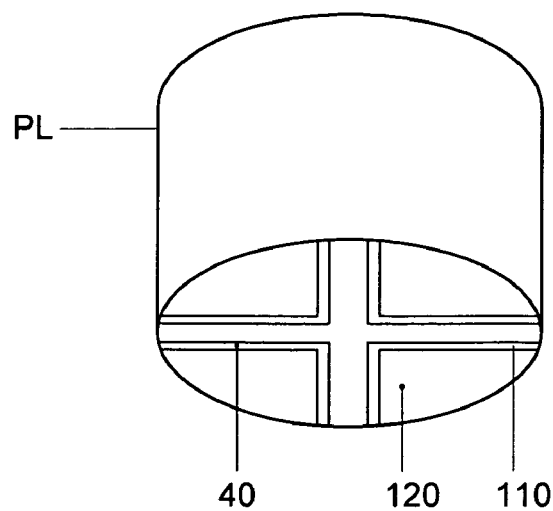
FIG. 3 depicts details of a lithographic apparatus including a projection system protector according to a further embodiment of the present invention.

FIG. 3 depicts details of a lithographic apparatus including a projection system protector according to a further embodiment of the present invention. In FIG. 3, the nucleated surface 40 is formed using at least one tube, preferably, a quartz tube. Preferably, the nucleated surface includes at least one tube 110 disposed on a surface 120, which may or may not be the external surface of the entry or exit lens element, wherein the at least one tube 110 is arranged on the surface 120, so that in use, the tube 110 is offset from the beam entry or exit area 70, 90 (not shown in FIG. 3) in a direction of propagation of the beam and is adjacent to either the beam entry area or the beam exit area. The tube or tubes 1 10 may be attached to the lens element using glue or some other conventional attaching means, such as attaching to the lens body with the use of clamps or by disposing a circular piece around the lens where the circular piece is smaller than the place of largest diameter of the lens, so that it hangs on the lens. As can be seen from FIG. 3, it is not necessary that the tube or tubes 110 surround the entire perimeter of the cross section of the beam in the direction of its propagation through the apparatus. Preferably, however, the nucleated surface 40 in both the embodiments shown in FIGS. 2 and 3, extends around, preferably at a nominal distance from, the area of the lens element through which the beam enters and exits the projection system. In use, the distance at which the nucleated surface is disposed from the beam will depend on the exposures carried out by a particular lithographic apparatus. In particular, if a variety of beam cross sections are envisaged, it may be beneficial to dispose the nucleated surface 40 a sufficient distance to allow all envisaged beam profiles to be carried out without having to change the protective cap or arrangement of tubes on the lens elements. However, generally, for a particular beam profile, it is preferable that the nucleated surface 40, in use, is as close to the area of incidence of the beam without overlapping the exposure area in the plane of the entry and exit of the beam. Although, in FIG. 3, the nucleated surface is shown as an arrangement of tubes, the invention is not limited in this respect. Indeed, it is envisaged that the surface may include cubic, or any other geometric structures planted with nucleation sites.

Figure 4:
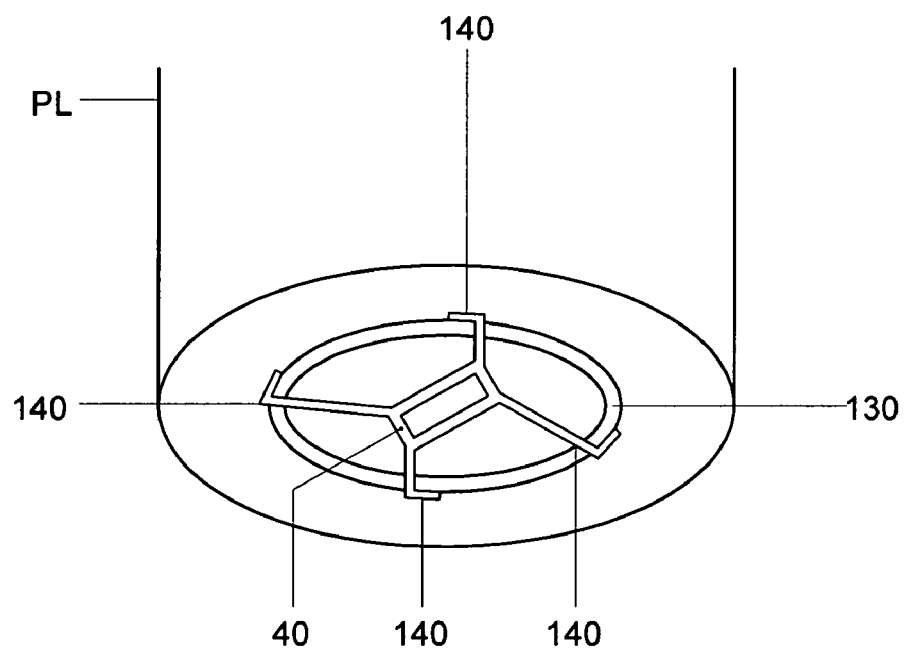
FIG. 4 depicts details of a lithographic apparatus including a projection system protector and attachments according to a further embodiment of the present invention.

FIG. 4 depicts details of a lithographic apparatus including a projection system protector and attachments according to a further embodiment of the present invention. The nucleated surface 40 is provided with attachment elements 140 for attaching nucleated surface 40 onto said projection system PL. In the embodiment shown in FIG. 4, the nucleated surface 40 is not disposed directly on the entry or exit lens element, but is rather disposed on a purge hood 130, which is disposed between the projection system PL and the nucleated surface 40. Attachment elements 140 are provided to attach the nucleated surface to the purge hood. As with FIG. 2 or 3, the nucleated surface may comprise etched quartz on which nucleation sites are disposed, or an arrangement of tubes. However, the invention is not limited in this respect, and as mentioned above, the nucleated surface may be attached directly to a lens element. The purge hood 130 is an optional component of a lithographic apparatus and includes components for introducing purified air into the apparatus.

Figure 5:
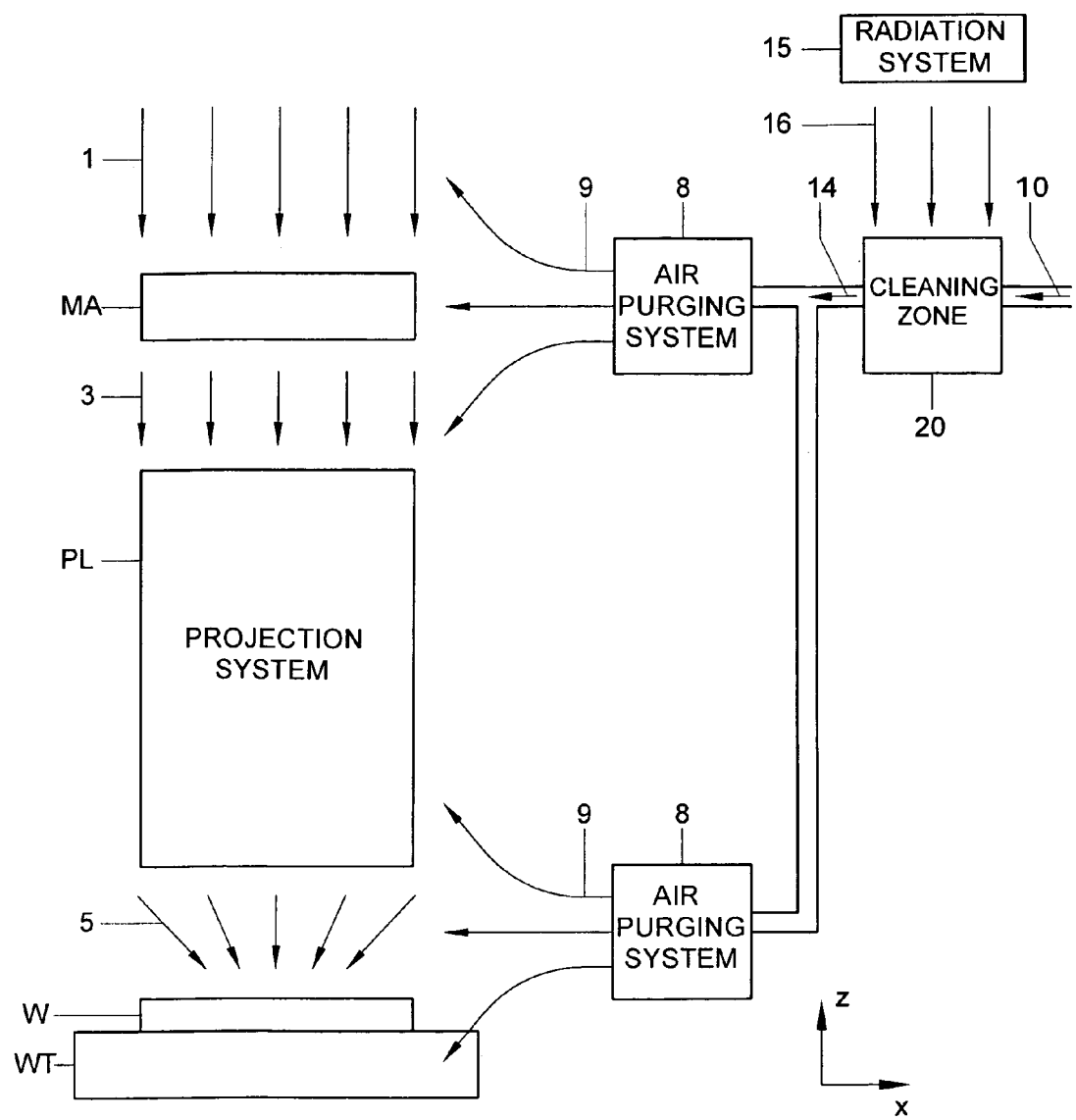
FIG. 5 depicts details of a lithographic apparatus including a fluid cleaning system according to an embodiment of the present invention.

FIG. 5 depicts details of a lithographic apparatus including a fluid cleaning system in which a nucleated surface is incorporated according to a further embodiment of the present invention. For those components shown in FIG. 5 having the same reference numeral or letter as corresponding components shown in FIG. 1, reference is made to the description of FIG. 1 above, as these components are not described further hereinbelow. FIG. 5 shows a projection beam of radiation 1, a patterning device MA, serving to pattern the projection beam according to a desired pattern, a patterned beam 3. The patterned beam having a particular cross sectional area is incident on a projection system PL at a projection system entry area (not shown in FIG. 5). The patterned beam exits the projection system via a beam entry area (not shown in FIG. 5). The exiting patterned beam 5 is subsequently incident on a substrate W, which is mounted on substrate table WT. FIG. 5 further shows a gas cleaning system 10, 14, 15, 16, 20 according to an embodiment of the invention which is for use with an apparatus such as the lithographic apparatus shown in FIGS. 1 and 5. Although, in the example shown, the fluid cleaning system is shown in use with a lithographic apparatus, the invention is not limited in this respect, and it is envisaged that the fluid cleaning system according to this embodiment of the present invention has application in other apparatus where clean fluid is necessary, such as wafer inspection tools, gas purification systems for bottled gases such as nitrogen or argon.

In the embodiments shown in FIGS. 5 to 8, the lithographic apparatus operates in a gaseous environment. The fluid cleaning system cleans the gas surrounding the projection system PL. As discussed below, the invention also has application in lithographic and other apparatus operating in a liquid environment. Also shown in FIG. 5 is a conventional gas cleaning system 8, also referred in the art as an gas purging system. Such a conventional gas cleaning system 8 is optional. It is envisaged that the gas cleaning system 10, 14, 15, 16, 20 shown in FIG. 5 may be used both together with a conventional system, or alternatively without a conventional gas cleaning system 8. Further, in the embodiment shown in FIG. 5, the gas cleaning system incorporating the present invention is disposed upstream in the direction of the gas flow of the conventional gas cleaning system 8. However, the invention is not limited in this respect, and it is envisaged that the gas cleaning system 10, 14, 15, 16, 20 may also be disposed downstream in the direction of the gas flow of the conventional gas cleaning system 8. The gas cleaning system has particular application to cleaning air. However, it is envisaged to be used for cleaning other gases such as nitrogen, argon, helium, neon and hydrogen, in which contaminants of the type described above are present.

Figure 6:
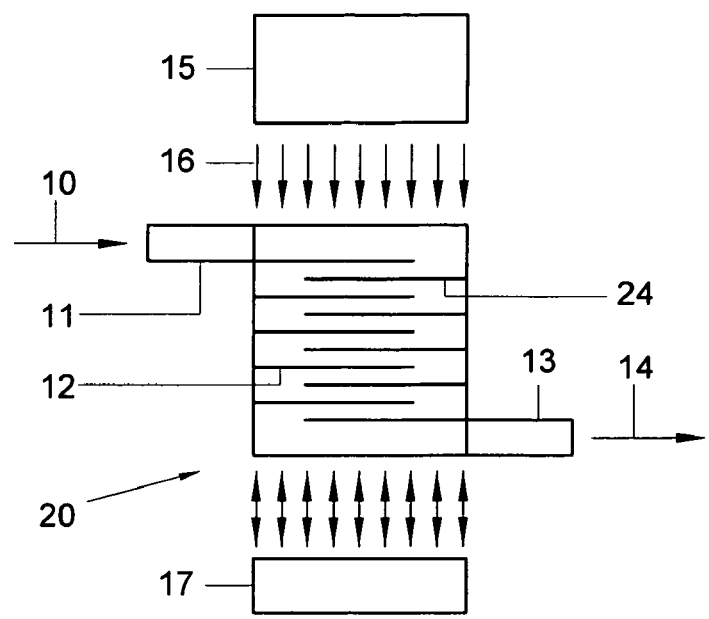
FIG. 6 depicts a fluid cleaning system according to an embodiment of the present invention.
Figure 7:
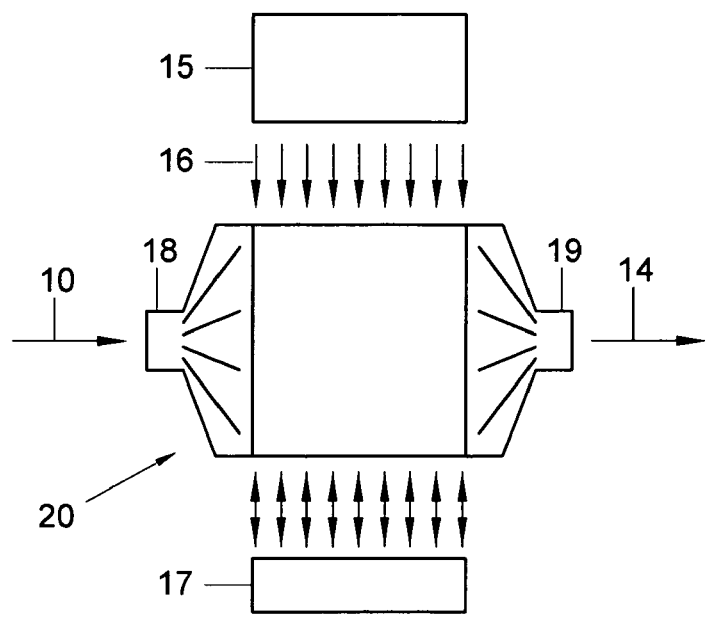
FIG. 7 depicts a fluid cleaning system according to a further embodiment of the present invention.
Figure 8:
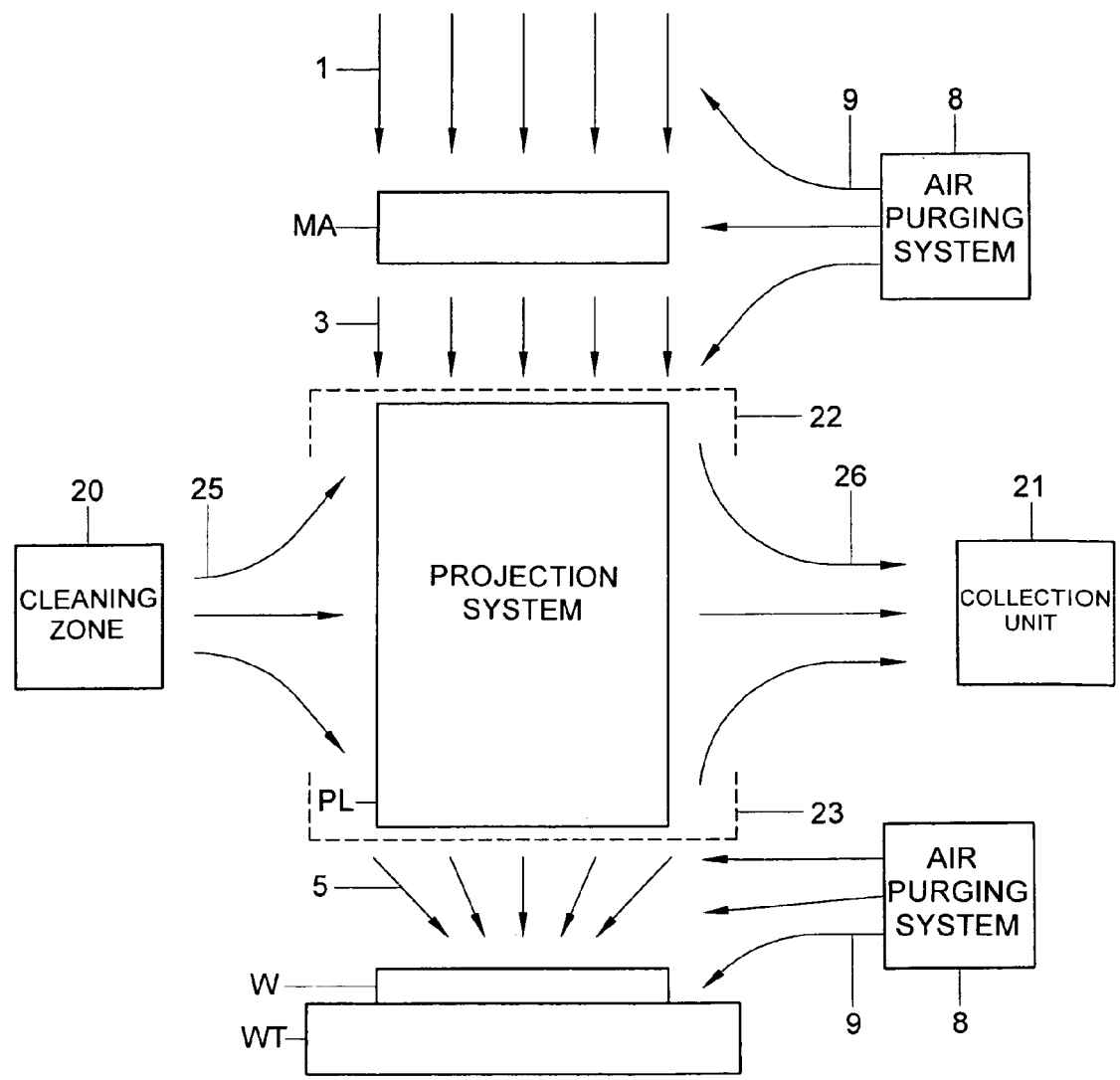
FIG. 8 depicts details of a lithographic apparatus including a fluid cleaning system according to a further embodiment of the present invention.

The gas cleaning system 10, 14, 15, 16, 20 according to the embodiments shown in FIGS. 5–8 cleans (or purifies) gas, typically nitrogen, using a method based on the principles of which cause the formation of salt crystal contaminants on the surfaces of the lens elements. It has been found that the contamination of the lens element, which is a problem with conventional systems, may be controlled in the following way. Firstly, those areas of the apparatus, typically a lithographic projection apparatus, requiring ultra clean air are identified. As mentioned, such areas are those above the first element in the projection system and below the last lens element in the projection system. Optionally, as shown in FIG. 8, optically transparent pellicules 22, 23 may be provided to separate those parts of the apparatus requiring ultra clean air from contamination sources. In a lithographic projection apparatus, such areas also include, for example, the mask MA area and the wafer W area. Secondly, a gas cleaning system 10, 14, 15, 16, 20 is incorporated, either in addition, or separate from conventional air purging systems 8, to provide ultra clean air to those identified regions. By identifying and isolating those areas of an apparatus requiring ultra clean gas, it is not necessary that the gas cleaning system be designed as a high throughput system. This further reduces the complexity and cost of the gas cleaning system required.

The gas cleaning system 10, 14, 15, 16, 20 is described in further detail with reference to FIGS. 6 and 7. Typically, however, the gas cleaning system includes a gas inlet 10 for receiving gas to be cleaned and a gas outlet and supply system 14 for supplying cleaned gas to the identified regions of the apparatus requiring clean gas, a cleaning zone 20 for cleaning the received gas, the cleaning zone being disposed between the inlet 10 and the outlet 14. The gas cleaning system further comprises a radiation system 15 for providing radiation 16 to the cleaning zone 20. The radiation is such that it causes dissociation of a contaminant present in the cleaning zone 20. The gas cleaning system further comprises a nucleated surface provided with a plurality of nucleation sites with which the dissociated contaminants associate, wherein the nucleated surface is disposed in the cleaning zone 20.

Typically, the radiation system has sufficient intensity, which may be less than that found in the lithographic apparatus.

The illumination of the gas to be cleaned takes place in the cleaning zone, which is preferably a specially designed chamber 20 where the gas to be cleaned is fed through. The chamber is designed so that the gas flows in the high radiation intensity area for a sufficiently large time, or along a sufficiently long path length to achieve dissociation of a contaminant in the cleaning zone and association of the dissociated contaminant with the nucleated surface. Preferably, the chamber contains a large active surface area, preferably of the same material as the lenses of the lithography apparatus or other apparatus for which the gas cleaner is intended, such as quartz silicon dioxide for G-line and I-line and KrF2 laser generation, magnesium fluoride for ArF2 laser generation and CaF2 for the F2-laser generation. Preferably, the active surface area of the nucleated surface, or alternatively, the whole chamber 20 is provided as a removable unit, which may be easily removed from the gas cleaning system for maintenance and replacement purposes. Preferably, the active surface area is rough. Preferably, the surface area of the active area is large in comparison to the surface area of the lens element.

The nucleated surface may be prepared by wiping the surface with a piece of cleaning cloth after a period of initial exposure of the chamber to radiation whilst gas passes through the chamber. This preparation induces slow contaminating growth of salt crystals on the surface. Alternatively, the dummy surface is pretreated under similar conditions, not during operation, to achieve nucleation of the active surface. A surface prepared in such a manner once installed in the gas cleaning system for an apparatus demonstrates enhanced contaminating growth on the nucleated surfaces due to the highly increased number of growth nuclei present on the surface. It has been found that by providing high nucleation site density of contaminating salts in the gas cleaning system, improved gas cleaning is achieved, as more contaminants are removed from the gas prior to its introduction into the identified areas, such as the area surrounding the lens elements.

In a particular embodiment, as shown in more detail in FIG. 6, the gas flow in the illumination chamber 20 is led through a system of channels formed with walls transparent to the radiation. In the embodiment, as shown in more detail in FIG. 7, the chamber is provided with a foamed or glass wool manufactured of the appropriate material, for example, from the lens materials mentioned above. The provision of channels or foamed or glass wool provides a large contact surface. The dwell time of the air in the illumination chamber 20, resulting from the channel design of FIG. 5 and the foam or glass wool filling of FIG. 6, combined with the turbulent flow dynamics of the gas, is arranged to provide sufficient contact with the nucleated surface. Preferably, the surface reaction probability, i.e., the probability of a contaminant dissociating and associating on the nucleated surface as a salt crystal in the illumination chamber, is rendered as high as possible in the illumination chamber. This is achieved as described above, by optimizing the surface area of the surface, the occurrence of nucleation sites on the surface, and by the intensity of the radiation incident in the chamber.

The gas cleaned by the gas cleaning system according the embodiments of the present invention is preferably used only near the lens surfaces of interest present in the identified regions in such a way that no other gas is able to reach these lens surfaces. These regions can be shielded from the rest of the apparatus volume by means of optically transparent pellicles 22, 23, shown in FIG. 8, which provide the possibility of recycling the ultra clean air and, hence, reducing the contamination rate and probability even further in the identified regions. In a particular embodiment of the present invention, the gas cleaning system 20, 21 shown in FIG. 8 is dispensed with, and the pellicles 22, 23 are provided with, nucleation sites which act as the surface with which a contaminant present in or around the projection system PL associates. The pellicles 22, 23 being disposed away from at least one of the patterned beam entry area or the patterned beam exit area.

FIG. 6 depicts details of a lithographic apparatus including a fluid cleaning system according to an embodiment of the present invention. Purge gas comprising precleaned gas or recycled ultra clean air 10 is provided via purge gas inlet 11. The cleaning zone comprises a chamber 12, and is preferably provided with obstructing walls 24. The chamber is illuminated with radiation 16 from source 15. Preferably, obstructing walls 24 are transparent to the radiation 16. The obstructing walls 24 are provided with nucleation sites, and thus form the nucleated surface. Preferably, the radiation is incident on the nucleated surfaces. In particular, the walls are disposed so as to define a gas path through which said gas passes from said gas inlet 11 to gas outlet 13. In particular, the walls 24 are arranged so that the gas path has a length longer than a dimension of the chamber in a direction of propagation of the radiation. It can be seen from FIG. 5 that the radiation propagates in the direction indicated by arrows 16. As the radiation propagates through the chamber 20, the radiation continues to propagate substantially in the same direction. However, it will be understood that the radiation may experience some changes in direction of propagation due to reflection and some absorption in the chamber. In particular, in order to exploit the energy of the radiation 16, a mirror 17 for reflecting the radiation exiting the chamber 20 is optionally provided. In the embodiments shown in the Figures, the mirror is depicted as being a flat mirror. However, the mirror may have any shape, including a spherical geometry. The mirror 17 reflects radiation exiting the chamber 20 back into the chamber in order that it may produce further dissociation of contaminants present in the gas in the chamber.

Further, in the embodiment shown in FIG. 6, it is seen that the walls are interleaved.

A contaminant in the gas passing through the cleaning zone is removed as described above. The gas 14 cleaned in the chamber is outlet to an apparatus, for example a lithographic projection apparatus, via an ultra clean purge gas outlet towards the apparatus.

FIG. 7 depicts a fluid cleaning system according to a further embodiment of the present invention. Purge gas comprising pre-cleaned gas or recycled ultra clean gas 10 is introduced into a pure gas inlet 18, which is structured to provide efficient gas flow distribution control. Preferably, the cleaning zone comprises a chamber 20, which includes a nucleated surface. Preferably, the nucleated surface comprises a surface of foamed or glass wool disposed in the chamber. The cleaned gas 14 is fed via a purge gas outlet 19, which is structured to provide efficient gas flow distribution control, to the desired location. As in the embodiment shown in FIG. 6, a mirror 17 is provided to reflect radiation exiting the chamber back into the chamber in order to exploit the energy of the radiation to achieve optimum dissociation of contaminants in the cleaning zone.

FIG. 8 depicts details of a lithographic apparatus including a fluid cleaning system according to a further embodiment of the present invention. In addition to those components already described with reference to FIGS. 1 and 5, FIG. 8 shows, as also already mentioned, optically transparent pellicules 22, 23 which function to restrict the circulation of the ultra clean gas cleaned by the gas cleaning system of the present invention, within the apparatus, to the desired regions. In addition, in the absence of the gas cleaning system 20, 21, the pellicles 22, 23 are provided with nucleation sites, so that the pellicles 22, 23 also function as the surface at which a contaminant associates. An ultra clean gas system 20, as previously described with reference to FIGS. 5–7, is preferably provided, which outputs gas to the region restricted by the pellicules 22, 23 in the direction of arrows 25. Preferably, the gas is blown with sufficient force to traverse the restricted region, in which for example, the projecting system is located. Provided on the opposite side of the restricted region is an ultra clean gas collection unit 21. The structure of the collection unit 21 is preferably the same as the delivery unit 20. However, it may have the structure of any of the embodiments of the gas cleaning system of the present invention. The collection unit 21 collects the gas emitted by the delivery unit and recycles it. The recycled gas may be output directly into the restricted region, or it may be fed back to the delivery unit 20 where it is cleaned once again before being reintroduced to the restricted region. It has been found that recycling the gas further reduces the contaminants present in the gas and thus further decreases the probability of a surface reaction occurring within the restricted region.

In the embodiments shown in FIGS. 5–8 it is seen that that the cleaning zone is disposed away from the patterned beam. Further, it is understood that the chamber is constructed so that the time it takes for the gas to pass from the inlet to the outlet is sufficient to achieve dissociation of a contaminant in the cleaning zone. Preferably, the nucleated surface is constructed so that the time it takes for the gas to pass from the inlet to the outlet is sufficient to achieve association of the dissociated contaminant at the nucleated surface. In particular, with reference to the application in a lithographic apparatus, the surface area of the nucleated surface is greater than the cross sectional area of the patterned beam.

As mentioned previously, the nucleation sites are salt crystal growth seeds and the association includes the formation of salt crystals at or in the vicinity of the nucleation sites. In particular, the contaminants are retained on the nucleated surface as salt crystals.

Further, the first radiation system providing the patterned beam and the second radiation system providing the dissociating radiation in the embodiments shown in FIGS. 5 and 8 may be the same. However, in an alternative embodiment, these radiation systems are independent from each other. The wavelength of the radiation provided by the second radiation system is not important, provided it causes dissociation of a particular contaminant. In one embodiment, the first and second radiation system provide radiation having substantially the same wavelength.

In FIG. 8, the cleaning unit 20 is shown as delivering clean air to one stepper unit. However, the invention is not limited in this respect, and it is envisaged that a single cleaning unit 20 may be used to supply clean air to a number of steppers, for example, steppers disposed in parallel to one another.

In the embodiments described above, reference is made to lithographic apparatus which operate in a gaseous environment. However, the invention is not limited to such apparatus. The present invention can be used to remove contaminants from fluids. Thus, a contaminant present in either a gas or a liquid will associate with the nucleated surface. In particular, the present invention also has application to immersion lithographic apparatus, i.e., lithographic apparatus which operate in a partially liquid environment. In immersion lithography, the space between the last lens of the projection system and the wafer is filled with a liquid. The liquid is typically water or oil. An example, of a typical oil is Fomblin, which is also used as pump oil. The present invention has application to clean the used water or oil before use or cleaning the fluid present between the last lens and the wafer. It has been found that the contamination of lenses is even greater in immersion lithography than in standard lithography.

In addition, the use of a "dummy" nucleated surface, i.e., a surface on which a plurality of nucleation sites are provided, may be used as a detector. For such an application, the nucleated surface is disposed in the fluid path, for example, at a fluid inlet where the fluid enters the apparatus. The nucleated surface is disposed within the path of a radiation beam of sufficient energy to cause crystal growth in the presence of a contaminant. The fluid to be tested is then passed over the surface. If the fluid contains a contaminant or contaminants, over time crystal growth will occur. The amount of crystal growth is related to the concentration of contaminants. Since the crystal growth affects the optical properties of the nucleated surface, the amount of growth, and hence the concentration of contaminants can be determined optically. Thus, a nucleated surface disposed in a radiation beam can be used to detect the concentration of contaminants in a fluid flowing along a fluid path, wherein the detecting surface is disposed. If it is found that the concentration of contaminants is high, as measured, the operation of the apparatus could be interrupted in order to replace the contaminated fluid and to prevent further contamination of elements within the apparatus, such as the lens elements in a lithographic apparatus. In this way, the nucleated surface can be used as a quality measure for the fluid in an apparatus. The optical detection may be done in reflection or transmission. Also, dark field methods can be applied where the direct beam is blocked and only the stray light is detected resulting in a much higher sensitivity. In particular, it is envisaged to provide a contamination detector for detecting contaminants in a fluid, the detector comprising: a fluid path along which the fluid for testing flows; a detection zone disposed in the fluid path; and a radiation source arranged, in use, to be incident on the detection zone; wherein the radiation source causes dissociation of a contaminant present in the fluid in the detection zone; and wherein the detector further comprises: a nucleated surface disposed in said detection zone, on which a plurality of nucleation sites are provided with one of which said dissociated contaminant associate and an optical measuring device for determining an optical characteristic of said nucleated surface from which the concentration of a contaminant in said fluid is determinable. Preferably, the characteristic which is measured is transmissivity or reflectivity of the nucleated surface.

While specific embodiments of the invention have been described above, it will be appreciated that the invention may be practiced otherwise than as described. The description is not intended to limit the invention.

What is claimed is:

1. A lithographic projection apparatus comprising:
    a first radiation system that provides a beam of radiation;
    a support structure that supports a patterning structure, the patterning structure configured to pattern the projection beam according to a desired pattern;
    a substrate support that supports a substrate;
    a projection system that projects the patterned beam onto a target portion of the substrate, said projection system including an optical element that has a beam entry area and an optical element that has a beam exit area through each of which said patterned beam passes;
    a fluid cleaning system that cleans a fluid to be introduced into a region in which said optical element is disposed, said fluid cleaning system comprising
        a fluid inlet that receives fluid to be cleaned and a fluid outlet that supplies cleaned fluid to said region of said apparatus,
        a cleaning zone that cleans said received fluid, said cleaning zone being disposed between said inlet and said outlet, and
        a second radiation system that provides radiation to said cleaning zone to cause dissociation of a contaminant present in said fluid in said cleaning zone; and
    a nucleated surface provided with a plurality of nucleation sites, wherein said nucleated surface is disposed in said cleaning zone.

2. A lithographic projection apparatus according to claim 1, wherein said cleaning zone is disposed away from said beam entry area and said beam exit area.

3. A lithographic projection apparatus according to claim 1, wherein said radiation is incident on said nucleated surface.

4. A lithographic projection apparatus according to claim 1, wherein said cleaning zone comprises a chamber.

5. A lithographic projection apparatus according to claim 4, wherein said chamber includes a plurality of walls transparent to said radiation, said walls disposed so as to define a fluid path through which said fluid passes from said fluid inlet to said fluid outlet.

6. A lithographic projection apparatus according to claim 5, wherein said walls are arranged so that said fluid path has a length longer than a dimension of said chamber in a direction of propagation of said radiation.

7. A lithographic projection apparatus according to claim 5, wherein said walls are interleaved.

8. A lithographic projection apparatus according to claim 1, wherein said nucleated surface comprises a surface of foamed or glass wool.

9. A lithographic projection apparatus according to claim 8, wherein said foamed or glass wool is disposed in said chamber.

10. A lithographic projection apparatus according to claim 1, wherein said chamber is constructed so that the time it takes for said fluid to pass from said inlet to said outlet is sufficient to achieve dissociation of a contaminant in said cleaning zone.

11. A lithographic projection apparatus according to claim 1, wherein said nucleated surface is constructed so that the time it takes for said fluid to pass from said inlet to said outlet is sufficient to achieve association of a dissociated contaminant with said nucleated surface.

12. A lithographic projection apparatus according to claim 1, wherein the surface area of said nucleated surface is greater than the surface area of a lens comprised in said projection system.

13. A lithographic projection apparatus according to claim 10, wherein said nucleation sites are salt crystal growth seeds sufficient to achieve association of a dissociated contaminant with said nucleated surface and said association includes the formation of salt crystals at or in the vicinity of said nucleation sites.

14. A lithographic projection apparatus according to claim 1, wherein said contaminants are retained on said nucleated surface as salt crystals.

15. A lithographic projection apparatus according to claim 1, wherein said first and second radiation systems are the same.

16. A lithographic projection apparatus according to claim 1, wherein said first and second radiation systems are independent from each other.

17. A lithographic projection apparatus according to claim 1, wherein said first and second radiation system provide radiation having substantially the same wavelength.

18. A lithographic projection apparatus according to claim 1, wherein said surface is replaceable.

* * * * *